United States Patent [19]
Takahashi

[11] Patent Number: 5,430,345
[45] Date of Patent: Jul. 4, 1995

[54] PIEZOELECTRIC DEVICE

[75] Inventor: Hiroyuki Takahashi, Nagaokakyo, Japan

[73] Assignee: Murata Manufacturing Co., Ltd., Nagaokakyo, Japan

[21] Appl. No.: 270,119

[22] Filed: Jul. 1, 1994

Related U.S. Application Data

[63] Continuation of Ser. No. 980,712, Nov. 24, 1992, abandoned.

[30] Foreign Application Priority Data

Jan. 9, 1992 [JP] Japan .................. 4-000333 U

[51] Int. Cl.6 .................. H03H 9/10; H01L 41/08
[52] U.S. Cl. .................. 310/348; 310/344
[58] Field of Search .................. 310/344, 348

[56] References Cited

U.S. PATENT DOCUMENTS

| | | | |
|---|---|---|---|
| 2,877,362 | 3/1959 | Tibbetts | 310/344 |
| 3,453,458 | 7/1969 | Curran et al. | 310/344 |
| 4,361,778 | 11/1982 | Luff et al. | 310/348 |
| 4,431,937 | 2/1984 | White | 310/344 |
| 4,471,259 | 9/1984 | Stoermer et al. | 310/344 |
| 4,485,325 | 11/1984 | Yamamoto et al. | 310/344 |
| 4,633,124 | 12/1986 | Kawashima | 310/348 |
| 4,992,693 | 2/1991 | Kishi et al. | 310/348 |
| 5,053,671 | 10/1991 | Kobayashi et al. | 310/344 |
| 5,208,506 | 5/1993 | Yamashita | 310/328 |
| 5,331,241 | 7/1994 | Itoh | 310/328 |

FOREIGN PATENT DOCUMENTS

| | | | |
|---|---|---|---|
| 2458150 | 12/1980 | France | 310/344 |
| 3247448 | 7/1984 | Germany | 310/344 |
| 0139516 | 8/1983 | Japan | 310/344 |

Primary Examiner—Thomas M. Dougherty
Attorney, Agent, or Firm—Burns, Doane, Swecker & Mathis

[57] ABSTRACT

A piezoelectric device is made by placing a piezoelectric substrate having oscillation electrodes on its front side and back side in a recess of a case and by sealing the recess with a lid. In both end portions of the case, there are provided substrate supporting portions which protrude from the recess and adhesive depositing portions adjacent to the substrate supporting portions, and inner electrodes are formed so as to cover the end portions of the case including the substrate supporting portions and the adhesive depositing portions. When the piezoelectric substrate is placed in the case, spaces are made between the piezoelectric substrate and the case at the adhesive depositing portions. A conductive adhesive is coated on the end portions of the substrate and then comes into the spaces. Thus, the conductive adhesive comes to the back side of the piezoelectric substrate and fills the adhesive depositing portions. Consequently, the oscillation electrodes are electrically connected with the inner electrodes by the conductive adhesive.

10 Claims, 2 Drawing Sheets and the contact portions 33a and 33b are electrically connected
PIEZOELECTRIC DEVICE This application is a continuation of application Ser. No. 07/980,712, filed Nov. 24. 1994, now abandoned.

BACKGROUND OF THE INVENTION

1. Field of the Invention

The present invention relates to a piezoelectric device to be installed in a filter circuit, an oscillation circuit or the like.

2. Description of Related Art

FIG. 4 shows a conventional piezoelectric device. The piezoelectric device comprises a piezoelectric substrate 31, an insulating case 35 having a recess 35a and a lid 36.

The piezoelectric substrate 31 has oscillation electrodes 32a and 32b on its front side and back side respectively. The piezoelectric substrate 31 is horizontally laid in the recess 35a. The oscillation electrodes 32a and 32b have contact portions 33a and 33b at their ends, and the contact portions 33a and 33b are electrically connected with inner electrodes 37a and 37b respectively by a conductive adhesive 34. The lid 36 covers an opening of the case 35 and is fixed thereon by an adhesive. The piezoelectric device has outer electrodes 38a, 38b and 38c thereon. The electrodes 38a and 38b are formed on the end portions, and the electrode 38c is formed on the center portion. The outer electrodes 38a and 38b are electrically connected with the inner electrodes 37a and 37b respectively.

In connecting the contact portions 33a and 33b with the inner electrodes 37a and 37b by the conductive adhesive 34, the conductive adhesive 34 must be put on the back side of the piezoelectric substrate 31 as well as the front side thereof because the contact portions 33a and 33b are on the front side and the back side. Conventionally, the following method has been adopted in order to put a conductive adhesive on the back side of the substrate 31 as well. The inner electrodes 37a and 37b are coated with a conductive paste in advance, and the piezoelectric substrate 31 is laid between the electrodes 37a and 37b. Further, the end portions of the substrate 31 are coated with the conductive paste. In this method, the coating process is repeated twice, and the number of processes is increased. Accordingly, the production cost is raised.

SUMMARY OF THE INVENTION

An object of the present invention is to provide a piezoelectric device having a structure which can facilitate the conductive adhesive coating process to fix the piezoelectric substrate in the case.

In order to attain the object, a piezoelectric device according to the present invention has a piezoelectric substrate having oscillation electrodes on its front side and back side, the piezoelectric substrate being contained in a recess of a case and covered by a lid, and inner electrodes are provided on the case such that the inner electrodes cover substrate supporting portions which protrude from the recess and adhesive depositing portions adjacent to the substrate supporting portions.

In the structure, the piezoelectric substrate is supported by the substrate supporting portions, and the adhesive depositing portions make spaces between the piezoelectric substrate and a wall of the case. Thereby, a conductive adhesive coated on the piezoelectric substrate comes into the spaces (adhesive depositing portions), that is, the conductive adhesive comes to the back side of the piezoelectric substrate. In this way, electrical connections between the oscillation electrodes provided on the piezoelectric substrate and the inner electrodes provided in the case can be achieved by performing the conductive adhesive coating only once.

BRIEF DESCRIPTION OF THE DRAWINGS

This and other objects and features of the present invention will be apparent from the following description with reference to the accompanying drawings in which.

DETAILED DESCRIPTION OF THE PREFERRED EMBODIMENTS

An exemplary piezoelectric device according to the present invention is described with reference to the accompanying drawings.

Figure 1:
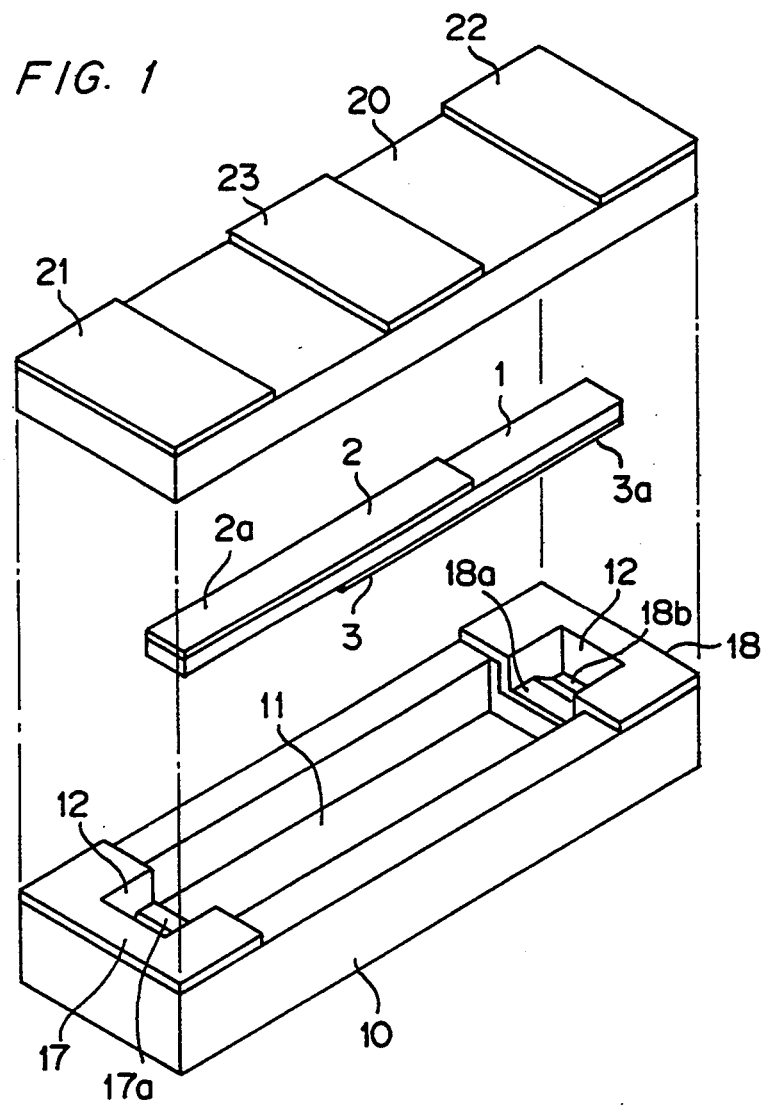
FIG. 1 is an exploded perspective view of a piezoelectric device which is an embodiment of the present invention.
Figure 2:
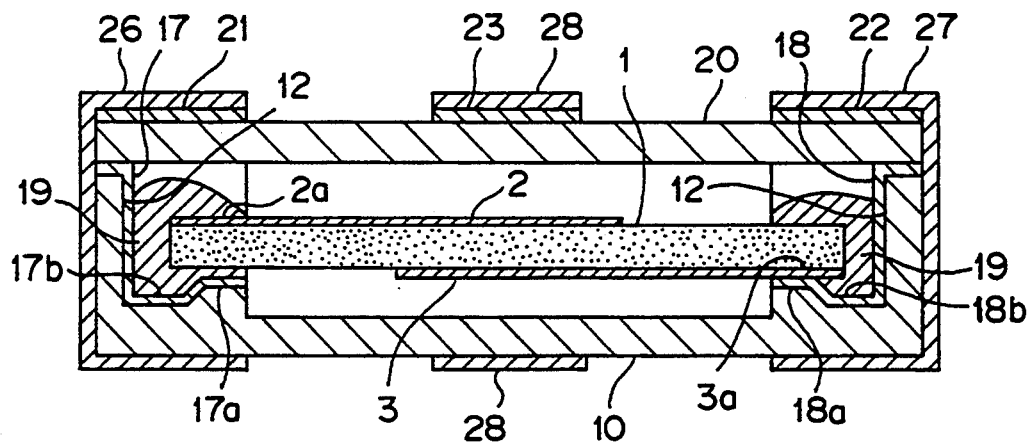
FIG. 2 is an elevational sectional view of the piezoelectric device.

As shown in FIGS. 1 and 2, a piezoelectric device comprises a piezoelectric substrate 1, an insulating case 10 which houses the piezoelectric substrate 1, and a lid 20. The piezoelectric substrate 1 has oscillation electrodes 2 and 3 on its front side and back side respectively. The oscillation electrodes 2 and 3 have contact portions 2a and 3a which extend to the edges of the piezoelectric substrate 1. The piezoelectric substrate 1 is made of a ceramic such as PZT, and the oscillation electrodes 2 and 3 are made of silver or the like. The piezoelectric substrate 1 vibrates in a shear mode.

The insulating case 10 has a recess 11, and cuts 12 are provided on both ends of the recess 11. The piezoelectric substrate 1 is put into the recess 11 laterally and horizontally guided by the cuts 12. Inner electrodes 17 and 18 are formed on the end portions of the front side of the insulating case 10 including the cuts 12. The electrodes 17 and 18 are formed by spattering, vapor deposition or the like. The electrodes 17 and 18 cover substrate supporting portions 17a and 18a which protrude from the recess 11 and adhesive depositing portions 17b and 18b adjacent to the substrate supporting portions 17a and 18a. The supporting portions 17a and 18a support end portions of the piezoelectric substrate 1 such that the vibrating part of the piezoelectric substrate 1 will not come into contact with the bottom of the recess 11.

The adhesive depositing portions 17b and 18b are provided to form spaces between the end portions of the substrate 1 and the insulating case 10 when the piezoelectric substrate 1 is put in the recess 11. When the end portions of the substrate 1 are coated with a conductive adhesive paste 19, the conductive adhesive paste 19 comes into the spaces between the end portions of the substrate 1 and the case 10 and fills the adhesive depositing portions 17b and 18b. Thereby, the contact portions 2a and 3a of the oscillation electrodes 2 and 3 are electrically connected with the inner electrodes 17 and 18 via the conductive adhesive 19. Thus, the coating of the conductive adhesive 19 is performed only once, and accordingly the production cost is low compared with the conventional production method wherein the conductive adhesive coating process is repeated twice. As the conductive adhesive 19, solder may be used.

Conductors 21, 22 and 23 are formed on the surface of the lid 20 by spattering, vapor deposition or the like. The lid 20 is fixed on the case 10 by an adhesive. Consequently, the piezoelectric substrate 1 is contained in a space sealed by the insulating case 10 and the lid 20.

Figure 3:
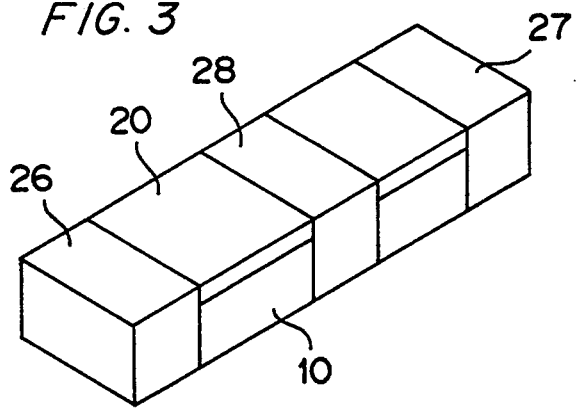
FIG. 3 is a perspective view of the piezoelectric device.
Figure 4:
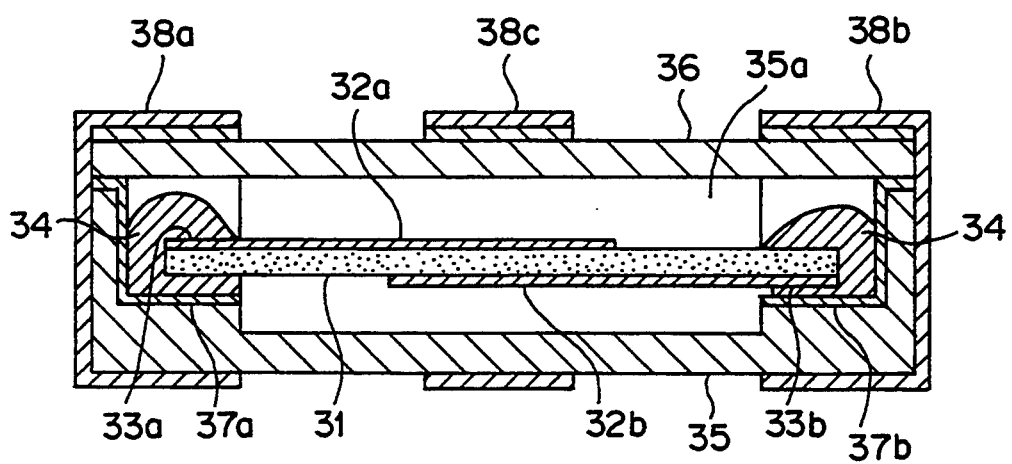
FIG. 4 is an elevational sectional view of a conventional piezoelectric device.

Outer electrodes 26, 27 and 28 are provided on the piezoelectric device. The outer electrodes 26, 27 and 28 can be used as an input electrode, an output electrode and a common electrode, respectively. The electrodes 26 and 27 are provided on the end portions, and the electrode 28 is provided on the center portion. The outer electrodes 26 and 27 are electrically connected with the inner electrodes 17 and 18 respectively. The outer electrodes 26, 27 and 28 are made of silver or the like by printing, spattering, vapor deposition or the like. Capacitance is generated between the electrodes 26 and 28 and between the electrodes 27 and 28. FIG. 3 shows the appearance of the piezoelectric device.

Although the present invention has been described in connection with the preferred embodiment above, it is to be noted that various changes and modifications are possible to those who are skilled in the art. Such changes and modifications are to be understood as being within the scope of the invention.

What is claimed is:

1. A piezoelectric device comprising:
    a piezoelectric substrate having an oscillation electrode on a front side and a back side;
    a case having a recess on a front side, the recess including portions for supporting the piezoelectric substrate, and including adhesive depositing portions recessed below ends of the substrate relative to said supporting portions;
    inner electrodes which cover the substrate supporting portions; and
    a lid for covering the recess;
    wherein the piezoelectric substrate is aligned by said recess laterally and horizontally with respect to the front side of the case.

2. A piezoelectric device as claimed in claim 1, wherein the oscillation electrodes provided on the piezoelectric substrate are electrically connected in the recess with the inner electrodes provided on the case by a conductive adhesive.

3. A piezoelectric device as claimed in claim 1, wherein the oscillation electrodes provided on the piezoelectric substrate are electrically connected in the recess with the inner electrodes provided on the case by solder.

4. A piezoelectric device as claimed in claim 1, further comprising:
    an input electrode and an output electrode provided on end portions of the piezoelectric device; and
    a common electrode provided on the piezoelectric device between the input electrode and the output electrode;
    wherein a capacitance is established between the input electrode and the common electrode, and between the output electrode and the common electrode.

5. A piezoelectric device comprising:
    a case having a recess formed on a front side, said recess having at least first and second raised support portions;
    a piezoelectric substrate mounted in said recess on said raised support portions and aligned laterally and horizontally by said recess with respect to the front side of said case, at least one of said raised support portions having an adhesive depositing portion recessed adjacent thereto at an end of the piezoelectric substrate; and
    a conductive adhesive placed in said adhesive depositing portion.

6. A piezoelectric device as recited in claim 5, further including:
    oscillation electrodes on the piezoelectric substrate; and
    inner electrodes provided within said recess for electrical connection with said oscillation electrodes.

7. A piezoelectric device as recited in claim 6, wherein said conductive adhesive electrically connects said oscillation electrodes with said inner electrodes.

8. A piezoelectric device as recited in claim 7, further comprising:
    an input electrode and an output electrode provided on said case and electrically connected with said inner electrodes; and
    a common electrode provided on said case between said input electrode and said output electrode such that a capacitance is established between the input electrode and the common electrode, and between the output electrode and the common electrode.

9. A piezoelectric device as recited in claim 8, wherein said oscillation electrodes further include:
    a first oscillation electrode mounted on a side of said piezoelectric substrate facing the front side of said case; and
    a second oscillation electrode mounted on a side of said piezoelectric substrate facing away from said front side.

10. A piezoelectric device as recited in claim 9, further comprising:
    a lid mounted on said case for sealing said recess, said lid being mounted on a side of said case opposite said front side.

* * * * *